United States Patent
Okino (10) Patent No.: US 6,664,551 B2
(45) Date of Patent: Dec. 16, 2003

(54) METHODS FOR DETECTING INCIDENCE ORTHOGONALITY OF A PATTERNED BEAM IN CHARGED-PARTICLE-BEAM (CPB) MICROLITHOGRAPHY, AND CPB MICROLITHOGRAPHY SYSTEMS THAT PERFORM SAME

(75) Inventor: Teruaki Okino, Kamakura (JP)

(73) Assignee: Nikon Corporation, Tokyo (JP)

( * ) Notice: Subject to any disclaimer, the term of this patent is extended or adjusted under 35 U.S.C. 154(b) by 0 days.

(21) Appl. No.: 10/264,004

(22) Filed: Oct. 2, 2002

(65) Prior Publication Data

US 2003/0085363 A1 May 8, 2003

(30) Foreign Application Priority Data

Oct. 2, 2001 (JP) ........................................ 2001-306670

(51) Int. Cl.[7] .............................................. H01J 37/304
(52) U.S. Cl. .................................. 250/491.1; 250/492.2
(58) Field of Search ............................ 250/491.1, 492.2

(56) References Cited

U.S. PATENT DOCUMENTS

| | | | | |
|---|---|---|---|---|
| 5,243,195 A | * | 9/1993 | Nishi | 250/548 |
| 5,760,411 A | * | 6/1998 | Kawakubo | 250/548 |
| 6,072,184 A | * | 6/2000 | Okino et al. | 250/492.2 |
| 6,147,355 A | * | 11/2000 | Ando et al. | 250/491.1 |
| 6,151,102 A | * | 11/2000 | Nishi | 355/53 |
| 6,204,509 B1 | * | 3/2001 | Yahiro et al. | 250/491.1 |
| 6,376,137 B1 | * | 4/2002 | Okino | 430/22 |
| 6,433,347 B1 | * | 8/2002 | Suzuki | 250/492.22 |

* cited by examiner

*Primary Examiner*—John R. Lee
*Assistant Examiner*—Paul M. Gurzo
(74) *Attorney, Agent, or Firm*—Klarquist Sparkman LLP (57) ABSTRACT

In the context of charged-particle-beam (CPB) microlithography methods and systems, methods are disclosed for detecting the incidence orthogonality of a patterned beam on the lithographic substrate. In an embodiment, the position of reticle-fiducial-mark images, as formed on the substrate stage at a position Z1, are detected at two lateral positions of a corresponding reticle fiducial mark. A distance L1 between the images is determined. Then, the substrate stage is moved to a position Z2, at which the position of reticle-fiducial-mark images are detected at two lateral positions of the corresponding reticle fiducial mark. A distance L2 between the images is determined. The incidence-orthogonality error $\Delta\theta$ is calculated by substitution into $\Delta\theta=(L1-L2)/2\Delta H$. The projection-optical system of the CPB microlithography apparatus is adjusted so that $\Delta\theta=0$.

32 Claims, 4 Drawing Sheets

METHODS FOR DETECTING INCIDENCE ORTHOGONALITY OF A PATTERNED BEAM IN CHARGED-PARTICLE-BEAM (CPB) MICROLITHOGRAPHY, AND CPB MICROLITHOGRAPHY SYSTEMS THAT PERFORM SAME

FIELD

This disclosure pertains to microlithography performed using a charged particle beam such as an electron beam or ion beam. Microlithography is a key technology used in the manufacture of microelectronic devices such as semiconductor integrated circuits, displays, and the like. More specifically, the disclosure pertains to methods, in the context of charged-particle-beam (CPB) microlithography, for detecting and maintaining orthogonality of the charged particle beam as incident on the lithographic substrate (e.g., semiconductor wafer).

BACKGROUND

Substantial research and development effort has been expended recently in the development of charged-particle-beam (CPB) microlithography systems (especially electron-beam microlithography systems) capable of producing extremely high pattern-transfer resolution as well as high throughput.

To such end, one system that has been researched extensively in the past is the "one-shot transfer" system, in which an entire "die" or "chip" (or even multiple dies or chips) is exposed in a single exposure "shot," similar to the usual manner of exposure in optical microlithography. However, a practical one-shot transfer system for use in CPB microlithography has defied realization for several reasons. One reason is that a reticle configured for one-shot exposure using a charged particle beam is extremely difficult to fabricate. Another reason is that it is extremely difficult, with CPB microlithography, to keep aberrations sufficiently corrected over an optical field sufficiently large for exposing an entire die in a single shot. For these reasons, one-shot transfer systems utilizing a charged particle beam currently are deemed impractical, and research interest in such systems has waned.

As a result, substantial interest has been directed to so-called "divided-reticle" CPB microlithography systems that utilize a reticle in which the pattern to be transferred is divided, or "segmented," into a large number of portions, termed "subfields," each defining a respective portion of the pattern. The subfields are exposed sequentially while the respective images of the subfields are formed on the lithographic substrate. Each subfield image is located so that, after exposing all the subfields of the pattern, the individual images collectively form a contiguous image of the pattern for a particular die. Such subfield images are termed "stitched" together. An advantage of performing pattern transfer in this manner is that subfield exposure can be performed while correcting aberrations and other imaging faults in real time for each subfield. Thus, lithographic exposures can be performed with greater resolution, accuracy, and precision across a very wide optical field, including optical fields wider than the one-shot fields exposed in optical microlithography.

One parameter not addressed by conventional CPB microlithography systems is the orthogonality of the charged particle beam as incident at the surface of the lithographic substrate. If the incidence orthogonality (i.e., normal incidence) of the beam at the surface of the substrate is not maintained, then stitching errors arise between adjacent subfield images on the substrate. These stitching errors, manifest as, e.g., reduced smoothness and integrity of connections between adjacent subfield images, yields correspondingly reduced pattern-transfer accuracy. Many microelectronic devices produced under these conditions exhibit substandard performance and unacceptably high failure rate.

SUMMARY

In view of the shortcomings of conventional methods as summarized above, the present invention provides, inter alia, charged-particle-beam (CPB) microlithography methods in which incident-beam orthogonality at the substrate surface is detected and maintained, thereby allowing pattern-transfer to be performed at higher accuracy than conventionally.

According to a first aspect of the invention, methods are provided, in the context of a CPB microlithography method, for determining an incidence orthogonality of the patterned beam on the substrate. In an embodiment of such a method, first and second reticle fiducial marks are placed laterally spaced apart from each other at a reticle plane. A charged particle beam is passed individually through each of the first and second reticle fiducial marks to form respective laterally spaced-apart images of the first and second reticle fiducial marks at each of first and second locations situated near a substrate plane. The first and second locations are separated from each other in an optical-axis direction by a distance $\Delta H$. A lateral distance L1, L2 between the respective images of the first and second reticle fiducial marks is measured at each of the first and second locations, respectively. The incidence-orthogonality error $\Delta\theta$ at the substrate surface is determined by calculating $\Delta\theta=(L1-L2)/2\Delta H$ for the first and second reticle fiducial marks.

In this method embodiment, the first and second reticle fiducial marks can be located in a subfield situated at the reticle plane. The first and second reticle fiducial marks desirably are located along respective opposing edges of the subfield. The subfield can be situated on a reticle or on a reticle stage, for example.

The first and second reticle fiducial marks desirably are laterally spaced from each other in an X direction, in which instance the respective images formed at each of the first and second locations are separated from each other in the X direction. Furthermore, the step of placing reticle fiducial marks desirably further comprises placing third and fourth reticle fiducial marks laterally spaced from each other in a Y direction at the reticle plane. The step of passing the charged particle beam desirably further comprises passing the charged particle beam individually through each of the third and fourth reticle fiducial marks to form respective laterally spaced-apart images of the third and fourth reticle fiducial marks at each of the first and second locations situated near the substrate plane. The measuring step desirably further comprises measuring a lateral distance L3, L4 between the respective images of the third and fourth reticle fiducial marks at each of the first and second locations, respectively. The determining step desirably further comprises determining an incidence-orthogonality error $\Delta\theta$ at the substrate surface by calculating $\Delta\theta=(L3-L4)/2\Delta H$ for the third and fourth reticle fiducial marks.

Also with respect to this method embodiment, the measuring step desirably comprises placing first and second substrate fiducial marks laterally spaced apart from each other near the substrate plane such that the substrate fiducial marks can be moved to each of the first and second locations. At each of the first and second locations, the respective images of the first and second fiducial marks are scanned over the first and second substrate fiducial marks, respectively. Backscattered electrons produced by scanning the respective images over the first and second substrate fiducial marks are detected.

Another embodiment of a method for determining incidence orthogonality of the patterned beam on the substrate comprises placing a first reticle fiducial mark on a movable body (e.g., reticle stage) located at a reticle plane. The movable body is laterally placeable at each of a first and second laterally displaced position on the reticle plane. A charged particle beam is passed through the first reticle fiducial mark at each of the two laterally displaced positions to form respective laterally spaced-apart images of the first reticle fiducial mark at each of first and second locations situated near a substrate plane. The first and second locations are separated from each other in an optical-axis direction by a distance $\Delta H$. A lateral distance L1, L2 between the respective first and second images of the first reticle fiducial mark at each of the first and second locations, respectively, is measured. The incidence-orthogonality error $\Delta\theta$ at the substrate surface is determined by calculating $\Delta\theta=(L1-L2)/2\Delta H$ for the first reticle fiducial mark.

The first and second positions desirably are spaced apart laterally from each other in an X direction, in which instance the respective images of the first reticle fiducial mark formed at each of the first and second locations are separated from each other in the X direction. Furthermore, a second fiducial mark can be placed on the movable body, wherein the movable body is laterally placeable at each of a first and a second laterally displaced position in the Y direction on the reticle plane. The charged particle beam is passed through the second reticle fiducial mark at each of the two laterally displaced positions in the Y direction to form respective laterally spaced-apart images of the second reticle fiducial mark at each of the first and second locations situated near the substrate plane. The lateral distance L1, L2 between the first and second images of the second reticle fiducial mark at each of the first and second locations, respectively, is measured. The incidence-orthogonality error ($\Delta\theta$) at the substrate surface is determined by calculating $\Delta\theta=(L1-L2)/2\Delta H$ for the second reticle fiducial mark.

The passing step can further comprise placing a first substrate fiducial mark near the substrate plane such that the first substrate fiducial mark can be moved to each of the first and second locations. At each of the first and second locations, the image of the first fiducial mark is scanned over the first substrate fiducial mark, while detecting backscattered electrons produced by scanning the image over the first substrate fiducial mark.

In another specific embodiment, the passing step can further comprise the steps of: (1) placing the movable body at the first position on the reticle plane, (2) passing the charged particle beam through the reticle fiducial mark at the first position to form a first image of the reticle fiducial mark at the first location, (3) placing the movable body at the second position on the reticle plane, (4) passing the charged particle beam through the reticle fiducial mark at the second position to form a second image of the reticle fiducial mark at the first location, (5) passing the charged particle beam through the reticle fiducial mark at the second position to form a first image of the reticle fiducial mark at the second location, (6) placing the movable body at the first position on the reticle plane, and (7) passing the charged particle beam through the reticle fiducial mark at the first position to form a second image of the reticle fiducial mark at the second location. In this embodiment the determining step can further comprise determining the incidence-orthogonality error ($\Delta\theta$) at the substrate surface by calculating $\Delta\theta=(L1-L2)/2\Delta H$ for the images of the first reticle fiducial mark at each of the first and second locations.

According to another aspect of the invention, CPB microlithography apparatus are provided for transferring a pattern to a substrate from a segmented reticle divided into multiple subfields defining respective portions of the pattern. An embodiment of such an apparatus comprises an illumination-optical system situated and configured to direct a charged-particle illumination beam from a source to individual subfields of the reticle, thereby forming a patterned beam propagating downstream from the reticle while carrying an aerial image of an illuminated subfield of the reticle. The apparatus also includes a projection-optical system situated downstream of the illumination-optical system and configured to direct the patterned beam to a lithographic substrate to form respective images, corresponding to the aerial images, stitched together on the substrate to form a transferred pattern on the substrate. The apparatus also includes a reticle stage, situated downstream of the illumination-optical system, for holding the reticle at a reticle plane during illumination of the subfields by the illumination beam. The apparatus also includes an incidence-orthogonality detector. In this embodiment the incidence-orthogonality detector comprises first and second reticle fiducial marks that are situated on the reticle stage and are laterally spaced apart from each other at the reticle plane. The detector also includes a substrate fiducial mark situated downstream of the projection-optical system near a substrate plane, wherein the substrate fiducial mark is placeable selectively at first and second lateral positions at each of first and second locations situated near the substrate plane. The first and second locations are separated from each other in an optical-axis direction by a distance $\Delta H$. The detector also includes a deflector situated and configured to deflect respective patterned beams, produced by passage of the illumination beam through the first and second reticle fiducial marks and to scan the patterned beams, carrying respective images of the first and second reticle fiducial marks, on the substrate fiducial mark at the first and second lateral positions, respectively, at each of the first and second locations. The detector also includes a measurement means for measuring the lateral distance L1, L2 between the respective images of the first and second reticle fiducial marks at each of the first and second locations, respectively. The detector also includes a determination means for determining, from L1, L2, and $\Delta H$, an incidence orthogonality $\Delta\theta$ of the patterned beam at the substrate plane, according to an expression $\Delta\theta=(L1-L2)/2\Delta H$.

The apparatus embodiment summarized above further can comprise means for making an adjustment to at least one of the projection-optical system and illumination-optical system to make $\Delta\theta=0$.

The first and second reticle fiducial marks desirably are located in a subfield situated at the reticle plane. In this instance the first and second reticle fiducial marks desirably are located along respective opposing edges of the subfield. The subfield containing the first and second fiducial marks can be situated on a reticle mounted to the reticle stage.

This apparatus embodiment further can comprise a substrate stage situated downstream of the projection-optical system. The substrate stage defines the substrate plane on which the substrate fiducial mark is situated, and is movable laterally so as to place the substrate fiducial mark selectively at the first and second lateral positions. The substrate stage additionally can be movable in an axial direction so as to place the substrate fiducial mark at each of the first and second locations.

In the apparatus embodiment summarized above, the first and second reticle fiducial marks can be spaced laterally from each other in the X direction, wherein the respective images formed at each of the first and second locations are separated from each other in the X direction. In this configuration the incidence-orthogonality detector further can comprise third and fourth reticle fiducial marks carried by the reticle stage. The third and fourth reticle fiducial marks are spaced laterally from each other in a Y direction at the reticle plane. Also, the illumination-optical system is configured to direct the illumination beam individually through the third and fourth reticle fiducial marks to form respective laterally spaced-apart images of the third and fourth reticle fiducial marks at each of the first and second locations. The measurement means additionally is configured to measure the lateral distance L3, L4 between the respective images of the third and fourth reticle fiducial marks at each of the first and second locations, respectively. The determination means additionally is configured to determine the incidence-orthogonality error $\Delta\theta$ at the substrate surface by calculating $\Delta\theta=(L3-L4)/2\Delta H$ for the third and fourth reticle fiducial marks.

The measurement means desirably comprises a BSE detector situated and configured to detect backscattered electrons from the substrate fiducial mark whenever an image of a reticle fiducial mark is scanned over the substrate fiducial mark.

According to another embodiment of a CPB microlithography apparatus, an illumination-optical system is situated and configured to direct a charged-particle illumination beam from a source to individual subfields of the reticle, thereby forming a patterned beam propagating downstream from the reticle while carrying an aerial image of an illuminated subfield of the reticle. A projection-optical system is situated downstream of the illumination-optical system and configured to direct the patterned beam to a lithographic substrate to form respective images, corresponding to the aerial images, stitched together on the substrate to form a transferred pattern on the substrate. A reticle stage is situated downstream of the illumination-optical system and used for holding the reticle at a reticle plane during illumination of the subfields by the illumination beam. A substrate stage is situated downstream of the projection-optical system and used for holding the substrate at a substrate plane during transfer of respective images of the subfields to corresponding locations on a lithographic substrate. The apparatus includes an incidence-orthogonality detector, comprising a first reticle fiducial mark situated on the reticle stage, wherein the reticle stage is laterally movable so as to place the first reticle fiducial mark selectively at each of first and second laterally displaced positions on the reticle plane. The detector includes a first substrate fiducial mark situated on the substrate stage, wherein the substrate stage is laterally movable so as to place the first substrate fiducial mark selectively at each of first and second laterally displaced positions near the substrate plane. Thus, the first substrate fiducial mark is placeable selectively at first and second locations near the substrate plane but separated from each other in an optical-axis direction by a distance $\Delta H$. The detector includes a deflector situated and configured to deflect the patterned beam, produced by passage of the illumination beam through the first reticle fiducial mark, and to scan the patterned beam, carrying an aerial image of the first reticle fiducial mark, on the substrate fiducial mark at the first and second lateral positions, respectively, at each of the first and second locations. The detector includes measurement means for measuring a lateral distance L1, L2 between the image of the first reticle fiducial mark at each of the first and second locations, respectively. The detector includes determination means for determining, from L1, L2, and $\Delta H$, an incidence orthogonality $\Delta\theta$ of the patterned beam at the substrate plane, according to an expression $\Delta\theta=(L1-L2)/2\Delta H$.

The apparatus further can comprise a means for making an adjustment to at least one of the projection-optical system and illumination-optical system to make $\Delta\theta=0$.

The first reticle fiducial mark desirably is located in a subfield situated at the reticle plane. In this instance the subfield containing the first fiducial mark can be situated on a reticle mounted to the reticle stage.

The substrate stage additionally can be movable in the axial direction so as to place the first substrate fiducial mark at each of the first and second locations.

In this embodiment the first and second laterally displaced positions on the reticle plane can be spaced laterally from each other in the X direction. In this configuration the reticle stage is laterally movable in the X direction so as to place the first reticle fiducial mark selectively at each of first and second laterally displaced position on the reticle plane. The respective images formed at each of the first and second locations are separated from each other in the X direction. Further regarding this embodiment, the incidence-orthogonality detector further can comprise a second reticle fiducial mark situated on the reticle stage, wherein the reticle stage is laterally movable in the Y direction so as to place the second reticle fiducial mark selectively at each of third and fourth laterally displaced positions on the reticle plane. The illumination-optical system additionally can be configured to direct the illumination beam through the second reticle fiducial mark at each of the third and fourth positions to form respective laterally spaced-apart images of the second reticle fiducial mark at each of the first and second locations. The measurement means additionally is configured to measure a lateral distance L3, L4 between the respective images of the second reticle fiducial mark at each of the third and fourth positions at each of the first and second locations, respectively. The determination means additionally is configured to determine an incidence-orthogonality error $\Delta\theta$ at the substrate surface by calculating $\Delta\theta=(L3-L4)/2\Delta H$ for the third and fourth reticle fiducial marks.

The measurement means can comprise a BSE detector situated and configured to detect backscattered electrons from the substrate fiducial mark whenever an image of a reticle fiducial mark is scanned over the substrate fiducial mark.

The foregoing and additional features and advantages of the invention will be more readily apparent from the following detailed description, which proceeds with reference to the accompanying drawings.

DETAILED DESCRIPTION

The invention is described below in the context of representative embodiments that are not intended to be limiting in any way.

Figure 2:
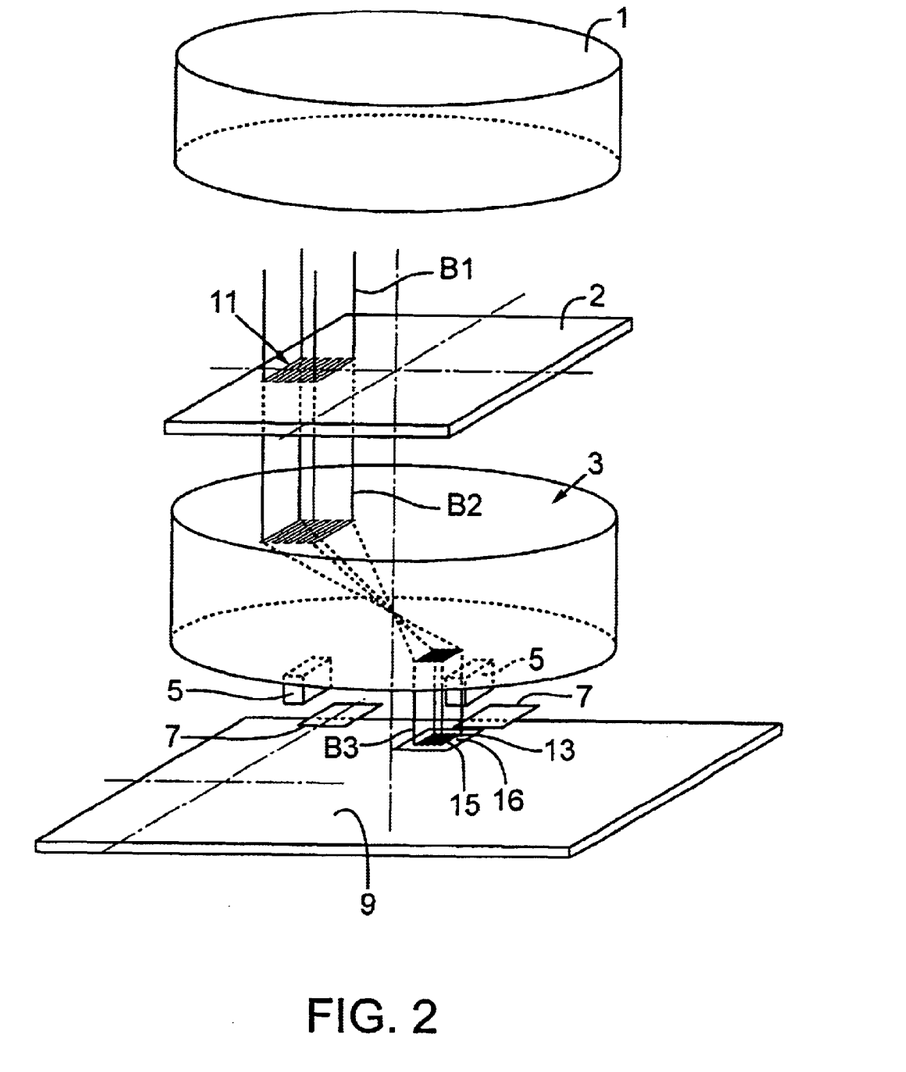
FIG. 2 is an oblique-view schematic diagram showing certain aspects of the configuration of a representative embodiment of a charged-particle-beam (CPB) microlithography system configured to detect incidence orthogonality.

Attention is directed first to FIG. 2, which is an oblique-view of a charged-particle-beam microlithography apparatus (notably an electron-beam microlithography apparatus) according to a representative embodiment. The depicted apparatus comprises a reticle stage 2 that receives an illumination beam B1 incident from upstream (from above in the figure). The illumination beam B1 is directed to the reticle stage 2 by an illumination-optical system 1. The illumination-optical system 1 typically includes the following components that are not shown but that are well-understood in the art: an electron gun, at least one condenser lens, a beam-shaping aperture, and at least one deflector. Defined on the reticle stage 2 is a reticle fiducial mark 11 (see FIG. 3), desirably comprising multiple linear mark elements arranged parallel to each other and located in a "reticle plane." Normally, the reticle fiducial mark 11 is defined as a hole pattern on a portion of the reticle stage (or of the reticle itself). The illumination beam B1 passing through the reticle fiducial mark 11 is "patterned" by the mark, producing the corresponding "patterned beam" B2. I.e., the beam B2 carries an aerial image of the reticle fiducial mark 11.

A projection-optical system 3 is situated downstream of the reticle stage 2. The projection-optical system 3 typically comprises the following components that are not shown but that are well-understood in the art: electromagnetic lenses, dynamic-focus coils, astigmatism-correction coils, and magnification/rotation-adjustment coils. The patterned beam B2 incident to the projection-optical system 3 is rotated and "reduced" (demagnified) by the action of the projection-optical system 3 to form a reduced patterned beam B3. The reduced patterned beam B3 carries a demagnified aerial image of the reticle fiducial mark 11 to a substrate stage 9. The substrate stage 9 is configured to hold a lithographic substrate during pattern-transfer.

Downstream of the projection-optical system 3 is a deflector 5 that electrostatically or electromagnetically deflects the reduced patterned beam B3 so that the beam B3 is incident at a desired location on the substrate stage 9. As the reduced patterned beam B3 is incident at the desired location, the beam B3 forms an image 13 of the reticle fiducial mark 11. At the location on the substrate stage 9, a mark member 16 is defined that desirably is made of a base material having a low coefficient of thermal expansion and/or that is non-conductive (e.g., ceramic or the like). Defined on the mark member 16 is a substrate fiducial mark 15. The substrate fiducial mark 15 is made from a thin film of a heavy metal (e.g., Ta) formed on the mark member 16. The deflector 5 scans the reduced patterned beam B3 (and thus the image 13) over the substrate fiducial mark 15.

A backscattered-electron (BSE) detector 7 is situated upstream of the substrate stage 9. As the image 13 is scanned over the substrate fiducial mark 15, the BSE detector 7 detects electrons backscattered from the substrate fiducial mark. The relative positional correlation between the image 13 of the reticle fiducial mark and the substrate fiducial mark 15 is measured by processing a scan signal produced by the BSE detector 7.

Figure 3:
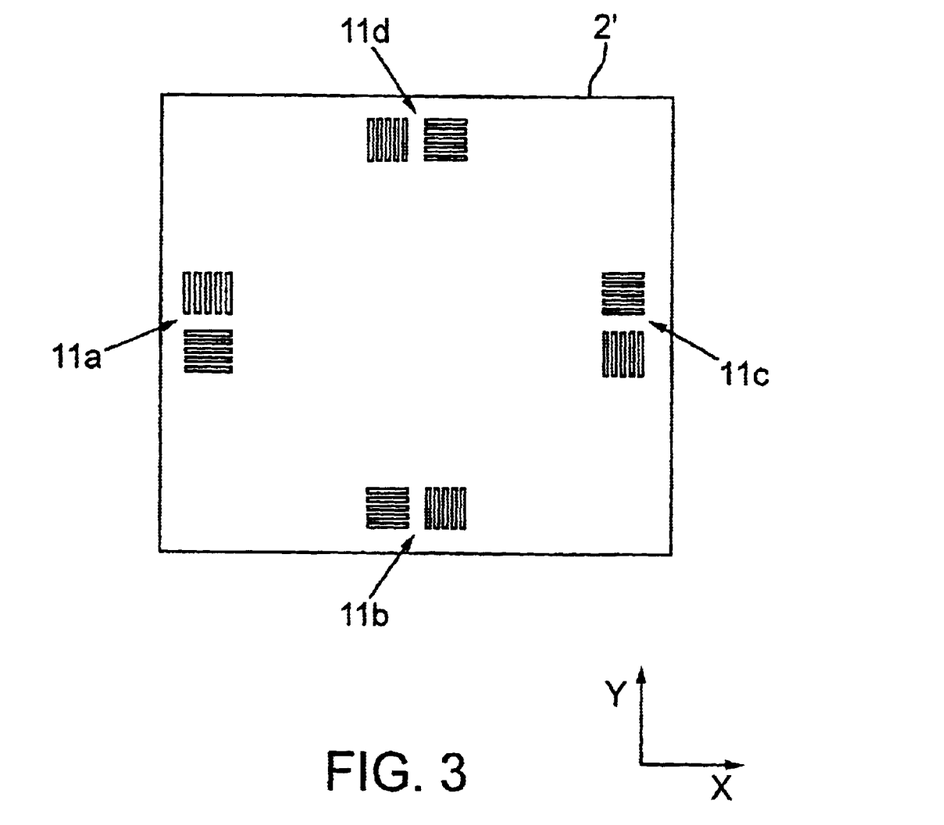
FIG. 3 is a plan view of a subfield comprising multiple reticle fiducial marks.

Exemplary reticle fiducial marks 11a–11d are shown in FIG. 3. The reticle fiducial marks 11a–11d are defined along respective edges of a subfield 2' on the reticle stage (or reticle). Specifically, each reticle fiducial mark 11a–11d is disposed at the center, in the X and Y directions, of a respective edge of the subfield 2'. Each reticle fiducial mark 11a–11d comprises a group of multiple line-and-space elements aligned in the X direction and a group of multiple line-and-space elements aligned in the Y direction. In each group, the respective line-and-space elements are parallel to each other.

Figure 1:
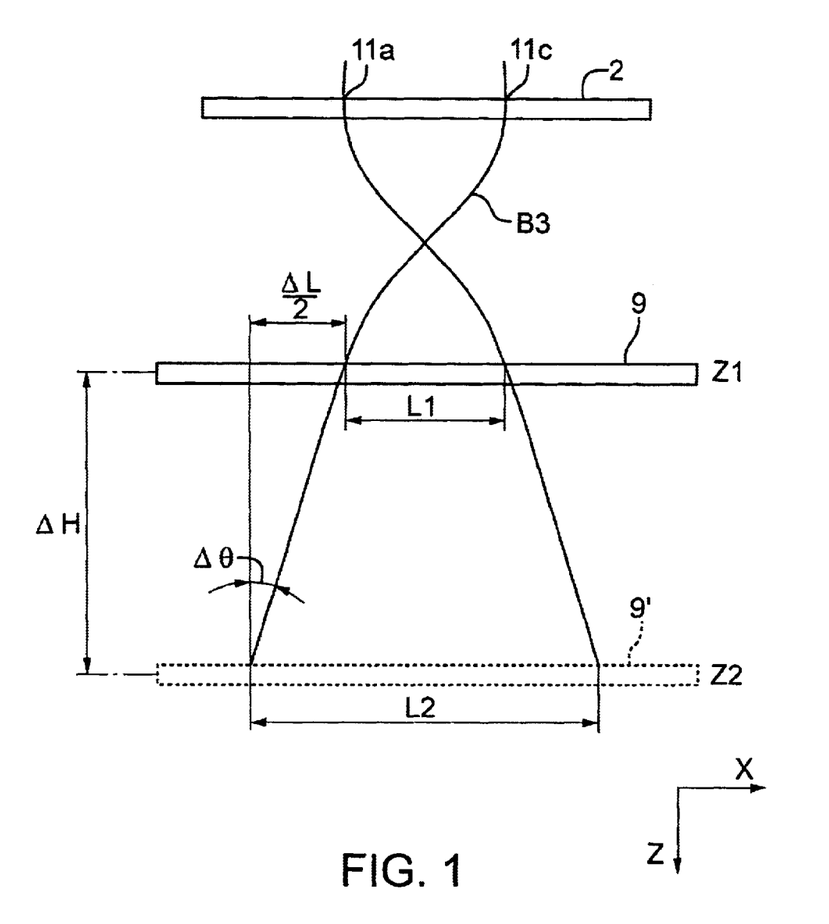
FIG. 1 is a schematic elevational diagram depicting the principles of incidence-orthogonality detection according to a first representative embodiment.

FIG. 1 schematically depicts, in the context of CPB microlithography, a method according to a first representative embodiment for detecting incidence orthogonality. A reticle stage 2 with reticle fiducial marks 11a–11d (only marks 11a, 11c are shown; see FIG. 3) is situated at the upstream end of the figure (top) in a reticle plane. The substrate stage 9 can be at either of two locations along the optical axis. These locations are denoted Z1 and Z2, respectively, and are situated near a "substrate plane" (i.e., plane at which an image formed on the substrate exhibits best focus). The axial distance between the locations Z1 and Z2 is denoted ΔH. The figure is drawn with an exaggerated ΔH. An actual ΔH is in the range of approximately ±2.5 μm of the focus position of the substrate stage 9. Thus, the location Z1 can be slightly upstream of the substrate plane, and the location Z2 can be slightly downstream of the substrate plane. The reduced patterned beam B3 is incident to the substrate stage 9, 9'. If non-orthogonality is present between the locations Z1 and Z2, then the reduced patterned beam B3 has an incidence-orthogonality error, denoted Δθ.

In this embodiment, the substrate stage 9 is moved laterally (while at the Z1 location) to position the substrate fiducial mark 15 at nearly the position of the image 13 of a selected reticle fiducial mark 11a, 11c on the stage. The deflector 5 is used to scan the image 13 of the selected reticle fiducial mark 11a, 11c over the substrate fiducial mark 15. As the image 13 is scanned over the substrate fiducial mark 15, backscattered electrons are detected by the BSE detector 7. Thus, the relative positions of the images of the reticle fiducial mark 11a and 11c are detected. L1 is the distance between the positions of the respective images 13 of the reticle fiducial marks 11a and 11c at this time.

Next, the substrate stage 9 is moved to the Z2 location (denoted substrate stage 9' in FIG. 1) and the respective positions of the respective images of the reticle fiducial marks 11a and 11c are detected. L2 is the distance between the positions of the images of the respective reticle fiducial marks 11a and 11c at this time.

Since Δθ actually is extremely small, the incidence-orthogonality error Δθ can be expressed as:

$$\Delta\theta=(L1-L2)/2\Delta H \tag{1}$$

By adjusting the projection-optical system (i.e., adjusting electrical current applied to respective components thereof), Δθ can be brought to 0 (zero). Thus, the incidence orthogonality of the patterned beam on the substrate can be maintained using multiple (in this instance, two) reticle fiducial marks per each of the X and Y directions. This allows pattern transfer to be performed at high accuracy and precision.

Figure 4:
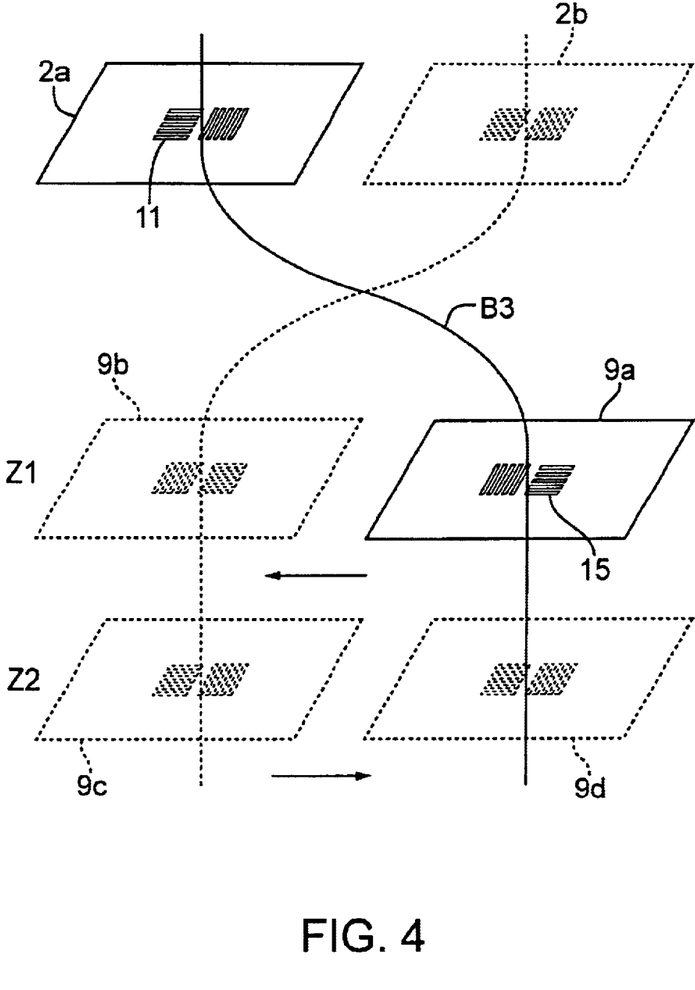
FIG. 4 is a schematic elevational diagram depicting the principles of incidence-orthogonality detection according to a second representative embodiment.

FIG. 4 schematically depicts a CPB microlithography method according to a second representative embodiment. For detection of incidence orthogonality in a particular X or Y direction, a reticle stage 2 contains a respective reticle fiducial mark 11 that comprises two sets of line-and-space elements, one set comprising multiple parallel elements extending in the X direction, and the other set comprising multiple parallel elements extending in the Y direction. Also, in a particular X or Y direction, the reticle stage 2 is movable so as to be displaceable to either of two respective lateral positions 2a, 2b. Thus, in a particular X or Y direction, the respective reticle fiducial mark 11 is displaceable in the reticle plane to two lateral positions. A substrate stage 9 is situated downstream of the reticle stage 2 and is displaceable to either of two locations in the Z direction: the Z1 and Z2 locations. For detecting of incidence orthogonality in a particular X or Y direction, the substrate stage 9 includes a respective substrate fiducial mark 15 that comprises two sets of line-and-space elements, one set comprising multiple parallel elements extending in the X direction, and the other set comprising multiple parallel elements extending in the Y direction. The substrate stage 9 also is movable so as to be displaceable to either of two lateral positions such that, at the Z1 location the substrate stage can be moved to either of two lateral positions 9a, 9b, and at the Z2 location the substrate stage can be moved to either of two lateral positions 9c, 9d. As in the first representative embodiment, the location Z1 can be slightly upstream of the substrate plane, and the location Z2 can be slightly downstream of the substrate plane. Thus, in a particular X or Y direction, the respective substrate fiducial mark 15 is displaceable near the substrate plane to two lateral positions.

The reduced patterned beam B3 is produced by passage of the charged particle beam through the reticle fiducial mark 11 and is deflected by the deflector 5 so as to be incident on the substrate fiducial mark 15. First, the reticle stage 2 and substrate stage 9 are positioned such that the reduced patterned beam B3 from the mark 11 on the reticle stage at position 2a can be scanned over the mark 15 on the substrate stage at position 9a. Then, the reticle stage 2 and substrate stage 9 are shifted laterally to the positions 2b and 9b, respectively, so that the reduced patterned beam B3 from the mark 11 on the reticle stage at position 2b can be scanned over the mark 15 on the substrate stage at position 9b. The distance L1 (see FIG. 1) between the mark 15 at the two positions 9a, 9b is found by detecting the marks at each of these two locations.

Next, the substrate stage 9 is shifted in the axial direction (Z direction) downstream to the Z2 location, thereby placing the substrate stage at the position 9c, while keeping the reticle stage 2 at the position 2b. With the stages so positioned, the reduced patterned beam B3 from the mark 11 on the reticle stage at position 2b is scanned over the mark 15 on the substrate stage at position 9c. Then, the reticle stage 2 and substrate stage 9 are shifted laterally to the positions 2a and 9d, respectively, so that the reduced patterned beam B3 from the mark 11 on the reticle stage at position 2a can be scanned over the mark 15 on the substrate stage at position 9d. The distance L2 (see FIG. 1) between the mark 15 at the two positions 9c, 9d is found by detecting the marks at each of these two locations.

The incidence-orthogonality error $\Delta\theta$ can be found by substituting L1, L2, and $\Delta H$ into Equation (1), above. By adjusting the projection-optical system (i.e., adjusting electrical current applied to respective components thereof), $\Delta\theta$ can be brought to 0 (zero). Thus, the incident orthogonality of the reduced patterned beam B3 on the substrate can be maintained using a single respective reticle fiducial mark 11 per each of the X and Y directions (a total of two reticle fiducial marks on the reticle). This allows pattern transfer to be performed at high accuracy and precision.

Any of various modifications can be made to the methods shown in FIGS. 1–4 and described above. For example, in the specifically disclosed embodiments the substrate stage was displaceable to two different locations Z1, Z2, respectively, along the Z axis. If the substrate stage in the subject CPB microlithography apparatus lacks a mechanism for adjusting the "height" (Z-direction location) of the substrate stage, then the incidence-orthogonality error $\Delta\theta$ can be found by disposing substrate fiducial marks at two locations Z1, Z2, respectively, on the wafer stage.

From the foregoing descriptions, it is readily understood that the incidence-orthogonality of the patterned beam at the substrate surface can be determined and thus maintained so as to achieve high-accuracy pattern transfer.

Whereas the invention has been described in connection with several representative embodiments, the invention is not limited to those embodiments. On the contrary, the invention is intended to encompass all modifications, alternatives, and equivalents as may be included within the spirit and scope of the invention, as defined by the appended claims.

What is claimed is:

1. In a charged-particle-beam (CPB) microlithography method, in which a pattern is defined on a segmented reticle divided into multiple subfields, the subfields are illuminated individually by an illumination beam to form a patterned beam, the patterned beam is projected to form corresponding subfield images on a lithographic substrate, and the subfield images are stitched together on the substrate to form a transferred pattern on the substrate, a method for determining an incidence orthogonality of the patterned beam on the substrate, the method comprising:

(a) placing first and second reticle fiducial marks laterally spaced apart from each other at a reticle plane;
    (b) passing a charged particle beam individually through each of the first and second reticle fiducial marks to form respective laterally spaced-apart images of the first and second reticle fiducial marks at each of first and second locations situated near a substrate plane, wherein the first and second locations are separated from each other in an optical-axis direction by a distance ($\Delta H$);
    (c) measuring a lateral distance (L1, L2) between the respective images of the first and second reticle fiducial marks at each of the first and second locations, respectively; and
    (d) determining the incidence-orthogonality error ($\Delta\theta$) at the substrate surface by calculating $\Delta\theta=(L1-L2)/2\Delta H$ for the first and second reticle fiducial marks.

2. The method of claim 1, wherein the first and second reticle fiducial marks are located in a subfield situated at the reticle plane.

3. The method of claim 2, wherein the first and second reticle fiducial marks are located along respective opposing edges of the subfield.

4. The method of claim 2, wherein the subfield is situated on a reticle.

5. The method of claim 2, wherein the subfield is located on a reticle stage.

6. The method of claim 1, wherein:
    the first and second reticle fiducial marks are laterally spaced from each other in an X direction; and
    the respective images formed at each of the first and second locations are separated from each other in the X direction.

7. The method of claim 6, wherein:
    step (a) further comprises placing third and fourth reticle fiducial marks laterally spaced from each other in a Y direction at the reticle plane;

step (b) further comprises passing the charged particle beam individually through each of the third and fourth reticle fiducial marks to form respective laterally spaced-apart images of the third and fourth reticle fiducial marks at each of the first and second locations situated near the substrate plane;

step (c) further comprises measuring a lateral distance (L3, L4) between the respective images of the third and fourth reticle fiducial marks at each of the first and second locations, respectively; and step (d) further comprises determining an incidence-orthogonality error ($\Delta\theta$) at the substrate surface by calculating $\Delta\theta=(L3-L4)/2\Delta H$ for the third and fourth reticle fiducial marks.

8. The method of claim 1, wherein step (c) comprises:

placing first and second substrate fiducial marks laterally spaced apart from each other near the substrate plane such that the substrate fiducial marks can be moved to each of the first and second locations;

at each of the first and second locations, scanning the respective images of the first and second fiducial marks over the first and second substrate fiducial marks, respectively; and detecting backscattered electrons produced by scanning the respective images over the first and second substrate fiducial marks.

9. In a charged-particle-beam (CPB) microlithography method, in which a pattern is defined on a segmented reticle divided into multiple subfields, the subfields are illuminated individually by an illumination beam to form a patterned beam, the patterned beam is projected to form corresponding subfield images on a lithographic substrate, and the subfield images are stitched together on the substrate to form a transferred pattern on the substrate, a method for determining an incidence orthogonality of the patterned beam on the substrate, the method comprising:

(a) placing a first reticle fiducial mark on a movable body located at a reticle plane, the movable body being laterally placeable at each of first and second laterally displaced positions on the reticle plane;

(b) passing a charged particle beam through the first reticle fiducial mark at each of the two laterally displaced positions to form respective laterally spaced-apart images of the first reticle fiducial mark at each of first and second locations situated near a substrate plane, wherein the first and second locations are separated from each other in an optical-axis direction by a distance ($\Delta H$), and measuring a lateral distance (L1, L2) between the respective first and second images of the first reticle fiducial mark at each of the first and second locations, respectively; and (c) determining the incidence-orthogonality error ($\Delta\theta$) at the substrate surface by calculating $\Delta\theta=(L1-L2)/2\Delta H$ for the first reticle fiducial mark.

10. The method of claim 9, wherein the movable body is a reticle stage.

11. The method of claim 9, wherein:

the first and second positions are spaced apart laterally from each other in an X direction; and the respective images of the first reticle fiducial mark formed at each of the first and second locations are separated from each other in the X direction.

12. The method of claim 11, wherein:

step (a) further comprises placing a second fiducial mark on the movable body, the movable body being laterally placeable at each of a first and a second laterally displaced position in the Y direction on the reticle plane;

step (b) further comprises passing the charged particle beam through the second reticle fiducial mark at each of the two laterally displaced positions in the Y direction to form respective laterally spaced-apart images of the second reticle fiducial mark at each of the first and second locations situated near the substrate plane, and measuring the lateral distance (L1, L2) between the first and second images of the second reticle fiducial mark at each of the first and second locations, respectively; and step (c) further comprises determining the incidence-orthogonality error ($\Delta\theta$) at the substrate surface by calculating $\Delta\theta=(L1-L2)/2\Delta H$ for the second reticle fiducial mark.

13. The method of claim 9, wherein step (b) further comprises:

placing a first substrate fiducial mark near the substrate plane such that the first substrate fiducial mark can be moved to each of the first and second locations;

at each of the first and second locations, scanning the image of the first fiducial mark over the first substrate fiducial mark; and detecting backscattered electrons produced by scanning the image over the first substrate fiducial mark.

14. The method of claim 9, wherein:

step (b) further comprises (1) placing the movable body at the first position on the reticle plane, (2) passing the charged particle beam through the reticle fiducial mark at the first position to form a first image of the reticle fiducial mark at the first location, (3) placing the movable body at the second position on the reticle plane, (4) passing the charged particle beam through the reticle fiducial mark at the second position to form a second image of the reticle fiducial mark at the first location, (5) passing the charged particle beam through the reticle fiducial mark at the second position to form a first image of the reticle fiducial mark at the second location, (6) placing the movable body at the first position on the reticle plane, and (7) passing the charged particle beam through the reticle fiducial mark at the first position to form a second image of the reticle fiducial mark at the second location; and step (c) further comprises determining the incidence-orthogonality error ($\Delta\theta$) at the substrate surface by calculating $\Delta\theta=(L1-L2)/2\Delta H$ for the images of the first reticle fiducial mark at each of the first and second locations.

15. A charged-particle-beam (CPB) microlithography apparatus for transferring a pattern to a substrate from a segmented reticle divided into multiple subfields defining respective portions of the pattern, the apparatus comprising:

an illumination-optical system situated and configured to direct a charged-particle illumination beam from a source to individual subfields of the reticle, thereby forming a patterned beam propagating downstream from the reticle while carrying an aerial image of an illuminated subfield of the reticle;

a projection-optical system situated downstream of the illumination-optical system and configured to direct the patterned beam to a lithographic substrate to form respective images, corresponding to the aerial images, stitched together on the substrate to form a transferred pattern on the substrate;

a reticle stage, situated downstream of the illumination-optical system, for holding the reticle at a reticle plane during illumination of the subfields by the illumination beam; and an incidence-orthogonality detector, comprising (a) first and second reticle fiducial marks situated on the reticle stage and being spaced apart laterally from each other at the reticle plane; (b) a substrate fiducial mark situated downstream of the projection-optical system near a substrate plane, the substrate fiducial mark being placeable selectively at first and second lateral positions at each of first and second locations situated near the substrate plane, wherein the first and second locations are separated from each other in an optical-axis direction by a distance ($\Delta H$); (c) a deflector situated and configured to deflect respective patterned beams, produced by passage of the illumination beam through the first and second reticle fiducial marks and to scan the patterned beams, carrying respective images of the first and second reticle fiducial marks, on the substrate fiducial mark at the first and second lateral positions, respectively, at each of the first and second locations; (d) measurement means for measuring a lateral distance (L1, L2) between the respective images of the first and second reticle fiducial marks at each of the first and second locations, respectively; and (e) determination means for determining, from L1, L2, and $\Delta H$, an incidence orthogonality ($\Delta\theta$) of the patterned beam at the substrate plane, according to an expression $\Delta\theta = (L1-L2)/2\Delta H$.

16. The apparatus of claim 15, further comprising means for making an adjustment to at least one of the projection-optical system and illumination-optical system to make $\Delta\theta=0$.

17. The apparatus of claim 15, wherein the first and second reticle fiducial marks are located in a subfield situated at the reticle plane.

18. The apparatus of claim 17, wherein the first and second reticle fiducial marks are located along respective opposing edges of the subfield.

19. The apparatus of claim 17, wherein the subfield containing the first and second fiducial marks is situated on a reticle mounted to the reticle stage.

20. The apparatus of claim 15, further comprising a substrate stage situated downstream of the projection-optical system and defining the substrate plane on which the substrate fiducial mark is situated, the substrate stage being movable laterally so as to place the substrate fiducial mark selectively at the first and second lateral positions.

21. The apparatus of claim 20, wherein the substrate stage additionally is movable in an axial direction so as to place the substrate fiducial mark at each of the first and second locations.

22. The apparatus of claim 15, wherein:
the first and second reticle fiducial marks are laterally spaced from each other in the X direction; and
the respective images formed at each of the first and second locations are separated from each other in the X direction.

23. The apparatus of claim 22, wherein:
the incidence-orthogonality detector further comprises third and fourth reticle fiducial marks carried by the reticle stage, the third and fourth reticle fiducial marks being spaced laterally from each other in a Y direction at the reticle plane;
the illumination-optical system additionally is configured to direct the illumination beam individually through the third and fourth reticle fiducial marks to form respective laterally spaced-apart images of the third and fourth reticle fiducial marks at each of the first and second locations;

the measurement means additionally is configured to measure a lateral distance (L3, L4) between the respective images of the third and fourth reticle fiducial marks at each of the first and second locations, respectively; and the determination means additionally is configured to determine an incidence-orthogonality error ($\Delta\theta$) at the substrate surface by calculating $\Delta\theta=(L3 L4)/2\Delta H$ for the third and fourth reticle fiducial marks.

24. The apparatus of claim 15, wherein the measurement means comprises a BSE detector situated and configured to detect backscattered electrons from the substrate fiducial mark whenever an image of a reticle fiducial mark is scanned over the substrate fiducial mark.

25. A charged-particle-beam (CPB) microlithography apparatus for transferring a pattern to a substrate from a segmented reticle divided into multiple subfields defining respective portions of the pattern, the apparatus comprising:

an illumination-optical system situated and configured to direct a charged-particle illumination beam from a source to individual subfields of the reticle, thereby forming a patterned beam propagating downstream from the reticle while carrying an aerial image of an illuminated subfield of the reticle;

a projection-optical system situated downstream of the illumination-optical system and configured to direct the patterned beam to a lithographic substrate to form respective images, corresponding to the aerial images, stitched together on the substrate to form a transferred pattern on the substrate;

a reticle stage situated downstream of the illumination-optical system, for holding the reticle at a reticle plane during illumination of the subfields by the illumination beam;

a substrate stage situated downstream of the projection-optical system, for holding the substrate at a substrate plane during transfer of respective images of the subfields to corresponding locations on a lithographic substrate; and an incidence-orthogonality detector, comprising (a) a first reticle fiducial mark situated on the reticle stage, the reticle stage being laterally movable so as to place the first reticle fiducial mark selectively at each of first and second laterally displaced positions on the reticle plane; (b) a first substrate fiducial mark situated on the substrate stage, the substrate stage being laterally movable so as to place the first substrate fiducial mark selectively at each of first and second laterally displaced positions near the substrate plane, the first substrate fiducial mark being placeable selectively at first and second locations near the substrate plane but separated from each other in an optical-axis direction by a distance ($\Delta H$); (c) a deflector situated and configured to deflect the patterned beam, produced by passage of the illumination beam through the first reticle fiducial mark, and to scan the patterned beam, carrying an aerial image of the first reticle fiducial mark, on the substrate fiducial mark at the first and second lateral positions, respectively, at each of the first and second locations; (d) measurement means for measuring a lateral distance (L1, L2) between the image of the first reticle fiducial mark at each of the first and second locations, respectively; and (e) determination means for determining, from L1, L2, and ΔH, an incidence orthogonality (Δθ) of the patterned beam at the substrate plane, according to an expression Δθ=(L1−L2)/2ΔH.

26. The apparatus of claim 25, further comprising means for making an adjustment to at least one of the projection-optical system and illumination-optical system to make Δθ=0.

27. The apparatus of claim 25, wherein the first reticle fiducial mark is located in a subfield situated at the reticle plane.

28. The apparatus of claim 27, wherein the subfield containing the first fiducial mark is situated on a reticle mounted to the reticle stage.

29. The apparatus of claim 15, wherein the substrate stage additionally is movable in the axial direction so as to place the first substrate fiducial mark at each of the first and second locations.

30. The apparatus of claim 25, wherein:
the first and second laterally displaced positions on the reticle plane are laterally spaced from each other in the X direction;
the reticle stage is laterally movable in the X direction so as to place the first reticle fiducial mark selectively at each of a first and a second laterally displaced position on the reticle plane; and
the respective images formed at each of the first and second locations are separated from each other in the X direction.

31. The apparatus of claim 30, wherein:
the incidence-orthogonality detector further comprises a second reticle fiducial mark situated on the reticle stage, the reticle stage being laterally movable in the Y direction so as to place the second reticle fiducial mark selectively at each of third and fourth laterally displaced positions on the reticle plane;
the illumination-optical system additionally is configured to direct the illumination beam through the second reticle fiducial mark at each of the third and fourth positions to form respective laterally spaced-apart images of the second reticle fiducial mark at each of the first and second locations;
the measurement means additionally is configured to measure a lateral distance (L3, L4) between the respective images of the second reticle fiducial mark at each of the third and fourth positions at each of the first and second locations, respectively; and
the determination means additionally is configured to determine an incidence-orthogonality error (Δθ) at the substrate surface by calculating Δθ=(L3−L4)/2ΔH for the third and fourth reticle fiducial marks.

32. The apparatus of claim 25, wherein the measurement means comprises a BSE detector situated and configured to detect backscattered electrons from the substrate fiducial mark whenever an image of a reticle fiducial mark is scanned over the substrate fiducial mark.

* * * * *

UNITED STATES PATENT AND TRADEMARK OFFICE
CERTIFICATE OF CORRECTION

PATENT NO. : 6,664,551 B2
DATED : December 16, 2003
INVENTOR(S) : Okino

It is certified that error appears in the above-identified patent and that said Letters Patent is hereby corrected as shown below:

Column 14,
Line 12, "(L3 L4)/2ΔH" should read -- (L3–L4)/2ΔH --.

Signed and Sealed this

Twenty-second Day of March, 2005

JON W. DUDAS
*Director of the United States Patent and Trademark Office*